(12) United States Patent
Kazama et al.

(10) Patent No.: US 11,552,624 B1
(45) Date of Patent: Jan. 10, 2023

(54) CONSTANT AMPLITUDE RAMP GENERATOR

(71) Applicant: Texas Instruments Incorporated, Dallas, TX (US)

(72) Inventors: Taisuke Kazama, Plano, TX (US); Saurav Bandyopadhyay, Dallas, TX (US); Tianyu Chang, Atlanta, GA (US); Huy Le Nhat Nguyen, Raleigh, NC (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 17/491,343

(22) Filed: Sep. 30, 2021

Related U.S. Application Data (60) Provisional application No. 63/235,068, filed on Aug. 19, 2021.

(51) Int. Cl.
*H03K 4/06* (2006.01)
*H03K 4/94* (2006.01)
*H03K 5/1252* (2006.01)

(52) U.S. Cl.
CPC .............. *H03K 4/94* (2013.01); *H03K 5/1252* (2013.01)

(58) Field of Classification Search
CPC ............ H03K 4/02; H03K 4/023; H03K 4/06; H03K 4/08; H03K 4/10; H03K 4/12; H03K 4/48; H03K 4/50; H03K 4/501; H03K 4/502; H03K 4/90; H03K 4/94; H03K 5/1252
See application file for complete search history.

(56) References Cited

U.S. PATENT DOCUMENTS

| | | | | |
|---|---|---|---|---|
| 5,659,587 A | * | 8/1997 | Knierim | ................. H03B 23/00 380/34 |
| 9,317,049 B2 | | 4/2016 | Guo | |

OTHER PUBLICATIONS

"PID Controller", Wikipedia, available at https://en.wikipedia.org/w/index.php?title=PID_controller&oldid=1042137171 on Sep. 3, 2021, pp. 1-27.
Carmen Parisi, Multiphase Buck Design from Start to Finish (Part 1), Application Report, Texas Instruments, Incorporated, Apr. 2017, Revised Apr. 2021, pp. 1-19.
"Accuracy-Enhanced Ramp-Generation Design for D-CAP3 Modulation", Application Report, SLVA762A, Texas Instruments, Incorporated, Jan. 2016, Revised Apr. 2016, pp. 1-9.
"Adaptive Constant On-Time (D-CAP) Control Study in Notebook Applications", Application Report, SLVA281B, Texas Instruments, Incorporated, Jul. 2007, Revised Dec. 2007, pp. 1-9.
"Constant Ripple Injection Circuit for Switching Converter", U.S. Appl. No. 17/008,253, filed Aug. 31, 2020, pp. 1-41.

* cited by examiner

*Primary Examiner* — Long Nguyen
(74) *Attorney, Agent, or Firm* — Ray A. King; Frank D. Cimino (57) ABSTRACT

In described examples of a ramp circuit, a first terminal of a capacitor is coupled to a ramp terminal and a second capacitor terminal is coupled to a return terminal. A charge source has an input terminal coupled to a supply terminal and a charge output terminal. A resistor has a first terminal coupled to the return terminal. A first switch is coupled between the ramp terminal and a second terminal of the resistor. A second switch is coupled between the charge output terminal and the ramp terminal.

17 Claims, 8 Drawing Sheets

CONSTANT AMPLITUDE RAMP GENERATOR

CROSS-REFERENCE TO RELATED APPLICATION

This application claims priority to U.S. Provisional Patent Application No. 63/235,068 filed Aug. 19, 2021, the entirety of which is incorporated herein by reference.

TECHNICAL FIELD

This relates to a constant ramp generator that may be used in a controller for a switching power supply.

BACKGROUND

Electronic systems often include power converters to convert a source voltage provided by a battery, for example, to a lower value that is needed for operation of integrated circuits within the system. There are many types of switching converters and output voltage regulation strategies. Typically, the output voltage is regulated based on directed feedback, which results in a control signal referred to as ripple injection. The amplitude of ripple injection varies with VIN and VOUT. A converter device that is optimized for low Vout (1.2V and lower), typically will have inferior performance at higher Vout (1.8V-5.5V), or vice versa.

A buck converter is a DC-to-DC power converter which steps down voltage from its input (supply) to its output (load). A boost converter is a DC-to-DC power converter that steps up voltage (while stepping down current) from its input (supply) to its output (load). Each type is a class of switched-mode power supply (SMPS) typically containing a semiconductor switching device and at least one energy storage element, such as a capacitor, inductor, or the two in combination. To reduce voltage ripple, filter capacitors are normally added to such a converter's output (load-side filter) and/or input (supply-side filter).

Switching converters provide much greater power efficiency as DC-to-DC converters than linear regulators, which are simpler circuits that reduces a voltage by dissipating power as heat. Buck converters can be highly efficient (often higher than 90%).

A feedback control loop monitors the output voltage and controls the switching rate and/or duty cycle to maintain the output voltage at a target value. Typically, a pulse width modulation (PWM) technique is used to control the cycle time of the switches and thereby regulate the output voltage.

SUMMARY

In described examples of a constant amplitude ramp circuit, a first terminal of a capacitor is coupled to a ramp terminal and a second capacitor terminal is coupled to a return terminal. A charge source has an input terminal coupled to a supply terminal and a charge output terminal. A resistor has a first terminal coupled to the return terminal. A first switch is coupled between the ramp terminal and a second terminal of the resistor. A second switch is coupled between the charge output terminal and the ramp terminal.

DETAILED DESCRIPTION

In the drawings, like elements are denoted by like reference numerals for consistency.

A switched-mode DC-DC converter is an important category in power supply design. Ideally, a switched-mode DC-DC converter can achieve close to 100% power conversion efficiency, and it has been widely used in many kinds of electronic devices such as computers, cell phones, TVs, and so forth. In a switched-mode DC-DC converter, the control loop design is very critical since it determines major performance parameters of the converter such as speed of load transient response, DC accuracy and design cost, which includes die size and number of off-chip components. Different control schemes have been developed during the past few decades to improve these parameters.

There are several varieties of control techniques used for buck converters. These control approaches include voltage mode, current mode, hysteretic mode, constant on-time mode, constant off time mode, and adaptive on-time mode (D-CAP® mode). Within these control schemes, voltage mode control and current mode control can achieve very good DC accuracy thanks to their high loop gain, but the load transient response is somewhat slow. Meanwhile, voltage mode and current mode control normally require several off-chip components for loop compensation which increases both design complexity and cost. D-CAP, D-CAP2, and D-CAP3 control schemes can achieve fast load transient response. The D-CAPn control schemes also remove the need for off-chip compensation components, thus making the part easier to be used and reducing design cost. With D-CAPn control schemes, offset generated from a current sense ramp creates variations on both a feedback voltage used to control the loop and an output voltage under different application conditions. The basic adaptive on-time mode technique is described in more detail is U.S. Pat. No. 9,317,049. The D-CAP2/3 techniques are described in "Accuracy-Enhanced Ramp-Generation Design for D-CAP3 Modulation," SLVA762A, Revised April 2016.

Typical controller architectures for switching converters use a ramp generator that is coupled to a switching terminal of the switching converter to emulate current flowing in a switched inductor. The load current is emulated by a current sense positive (CSP) signal and a current sense negative (CSN) signal provided by the ramp generator. In operation, the control circuit uses CSP and CSN as a ripple injection to adjust a feedback voltage (VFB). More specifically, CSP and CSN are used to generate a zero to compensate a double pole generated by the switched inductor and filter capacitor(s). Otherwise, the control loop may be unstable.

However, using the switching terminal for ramp generation usually makes the ramp amplitude dependent on operating conditions. With different output voltages, the ramp generator's amplitude varies, which affects the bandwidth of the control loop. This causes the controller to have a sub-optimal transient response across different output voltages. For example, if the controller is optimized for low output voltage such as 1.2V and lower, it will have inferior performance at a higher output voltage, such as 1.8V-5.5V.

Constant amplitude ramp generators solve this issue, see for example U.S. patent application Ser. No. 17/008,253, filed Aug. 31, 2020. However, in this example the implementations are complex and require multipliers and dividers making them impractical for products focused on small area and low power consumption.

In described examples, simple circuits for a constant amplitude ramp generator are provided. The circuits can be configured to emulate only a relevant slope depending on the controller configuration. A down slope is provided for DCAP2/3 type controllers that use valley current and an up slope is provided for advanced current mode (ACM) type controllers that use emulated peak current mode control. As described hereinbelow, a constant amplitude ramp generator is provided in which the ramp amplitude depends on the PWM timing rather than on the input voltage value.

In one example, a current source charges a capacitor for a fixed time. Following this, the capacitor is discharged by a resistor when the low side switch FET in the power converter is on. The charging time and the charging current set the height of the ramp which is constant with duty cycle.

In another example, a switched capacitor circuit is used to set the height of the ramp. The ramp height will be governed by the supply voltage and by a ratio of capacitors making it more immune to process and temperature variations.

In described examples, the constant amplitude ramp generator circuit is area efficient and immune to process variations. Current consumption by the constant amplitude ramp generator is minimal.

In described examples, high loop crossover and superior transient performance is provided compared to traditional implementations which may require a separate pin for setting the ramp amplitude as a function of output voltage. Good transient performance will allow use of a smaller output capacitor thereby allow a system to be smaller in size and cheaper.

Figure 1:
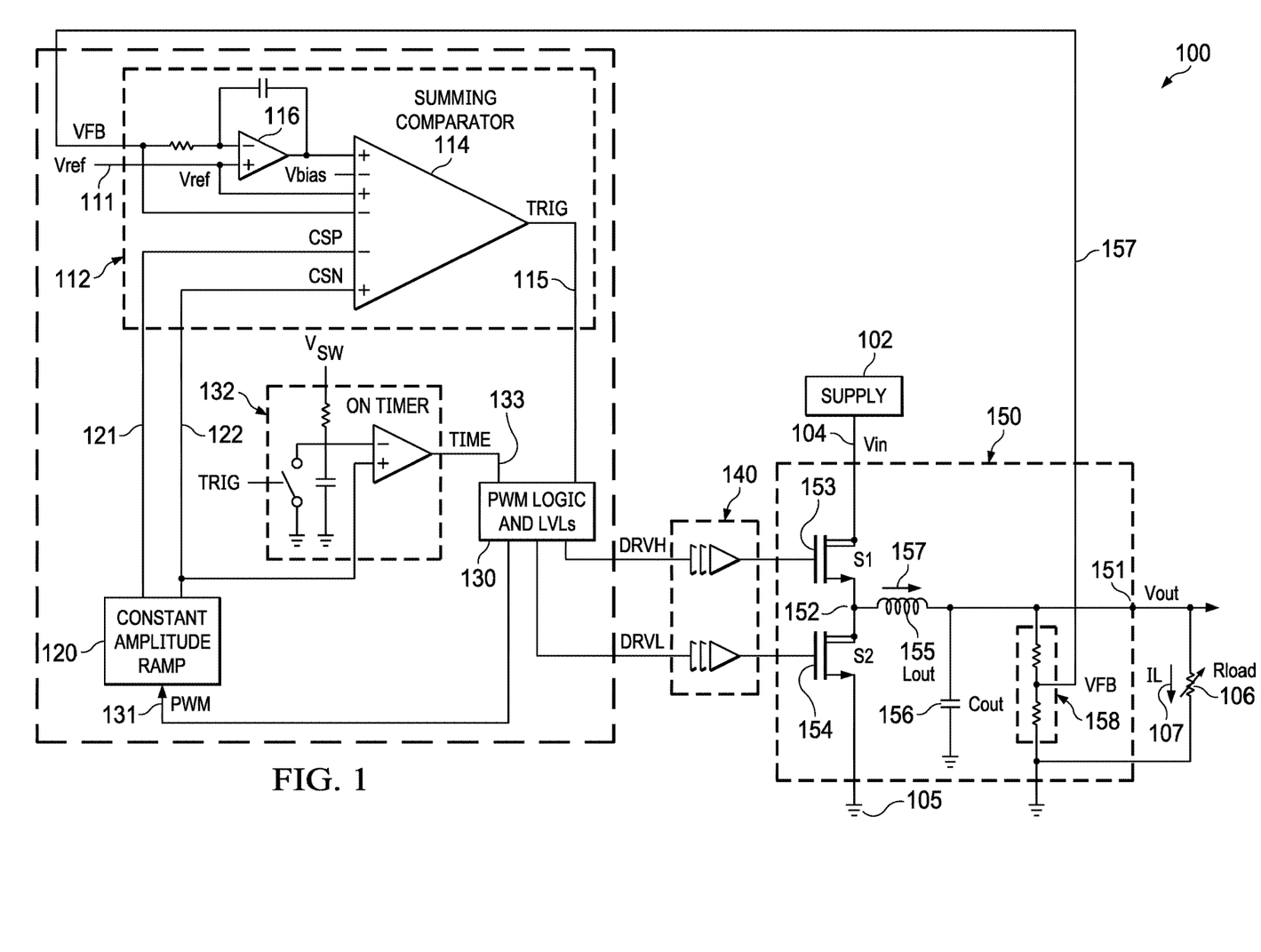
FIG. 1 is a block diagram of an example buck converter with a constant amplitude ramp generator.

FIG. 1 is a block diagram of an example buck converter system 100. This example is a single-phase regulator; however, it is also representative of one phase of multiphase regulator system. The general operation of multiphase switching techniques is known, see for example "Multiphase Buck Design From Start to Finish (Part 1)," SLVA882B, Revised April 2021. Buck converter system 100 includes switching converter circuitry 150 and a control circuit 110 for one or more power switches (S1, S2) 153, 154 of the switching converter circuitry 150. In this example, the switching converter circuitry 150 corresponds to a buck converter topology, where S1 is a high-side switch and S2 is a low-side switch. The switching converter circuitry 150 also includes an output inductor (Lout) 155, and an output filter capacitor (Cout) 156. In other examples, the switching converter circuitry 150 could have a boost converter topology, or another switching converter topology. In this example, power switches S1, S2 are high power field effect transistors (FET). In other examples, various types of known or later developed semiconductor switching devices may be used for power switches S1, S2.

In this example, a power supply 102 is coupled to Vin terminal 104. Switches S1 and S2 are coupled between Vin input terminal 104 and a ground terminal 105. One end of inductor Lout 155 is coupled to a switch terminal 152 between S1 and S2. An opposite end of inductor Lout is coupled to an output terminal 151. Output capacitor Cout 156 and a variable load (Rload) 106 are coupled in parallel between the output terminal 151 and the ground terminal 105. In a first state (S1 on, S2 off) of the switching converter circuitry 150, the inductor current 157 ramps up. In a second state (S1 off, S2 on), inductor current 157 ramps down. To regulate Vout at the output terminal 151, the timing of the first and second states is controlled by the control circuit 110. As the load current (IL) 107 increases in response to a change in the variable load 106, output voltage Vout tends to fall and control circuit 110 adjusts the timing of the first and second states to account for this change. For example, the length of the first state time may be increased subject to certain limits such as a minimum off-time.

In this example, pulse width modulation (PWM) logic 130 generates switch control signals to control high side switch S1 and low side switch S2, drive-high (DRVH) and drive-low (DRVL). PWM logic 130 also generates PWM signal 131 which in this example is the same as signal DRVH. The timing of the first state and the second state is a function of various signals including a first control signal (TRIG) 115 output from a loop control circuit 112 and a second control signal (TIME) 133 output from an on-time timer circuit 132. TRIG indicates when to turn S1 on; i.e., TRIG is used to generate switch drive-high (DRVH) signal. Meanwhile, TIME indicates when to turn S1 off. In some examples, there is a minimum off-time signal (not shown) to ensure DRVH is off for a minimum off-time. In some examples, the minimum off-time is provided by a minimum off-time signal generator. Often the minimum off-time is a fixed value for a given product.

In this example, the DRVH and DRVL signals are provided to buffer circuit 140 that amplifies the signals sufficiently to drive the gates of high power switching devices S1 153 and S2 154.

In this example, the loop control circuit 112 includes a comparator 114 that compares a feedback voltage (VFB) 157 with a target reference voltage (VREF) 111, where VREF is provided by a VREF source (not shown) and VFB is provided by a feedback loop that couples to the output terminal 151. In this example, the magnitude of VFB is first reduced by a voltage divider circuit 158. Loop control circuitry 112 accounts for variations in load current, where the load current is indicated by current sense positive (CSP) and current sense negative (CSN) provided by a constant amplitude ramp circuit 120. In operation, loop control 112 uses CSP and CSN as a ripple injection to adjust VFB. More specifically, CSP and CSN are used to generate a zero to compensate the double pole generated by LOUT 155 and COUT 156. Otherwise, the control loop may be unstable.

In this example, loop control circuit 112 also includes an integrator circuit 116 that includes an opamp with inputs coupled to Vref and Vfb. Thus, loop control circuit 116 may be referred to as an "integral" (I) control circuit. In another example, loop control circuit 112 may also include a proportional path and thus be referred to as a proportional-integral (PI) loop controller. In yet another example, loop control circuit 112 may also include a derivative path and thus be referred to as a proportional-integral-derivative (PID) loop controller. The general operation of PI and PID controllers is known, see, for example, "PID Controller," Wikipedia, September 2021.

As described hereinabove, some prior loop control techniques used a ramp generator that is connected to the switching terminal of a regulator, such as switching terminal 152 in this example. However, using the switching terminal for ramp generation usually makes the ramp amplitude dependent on operating conditions. With different output voltages, the ramp generator's amplitude varies, which affects the bandwidth of the control loop. This causes the controller to have a sub-optimal transient response across different output voltages. For example, if the controller is optimized for low output voltage such as 1.2V and lower, it will have inferior performance at a higher output voltage, such as 1.8V-5.5V.

Figure 2:
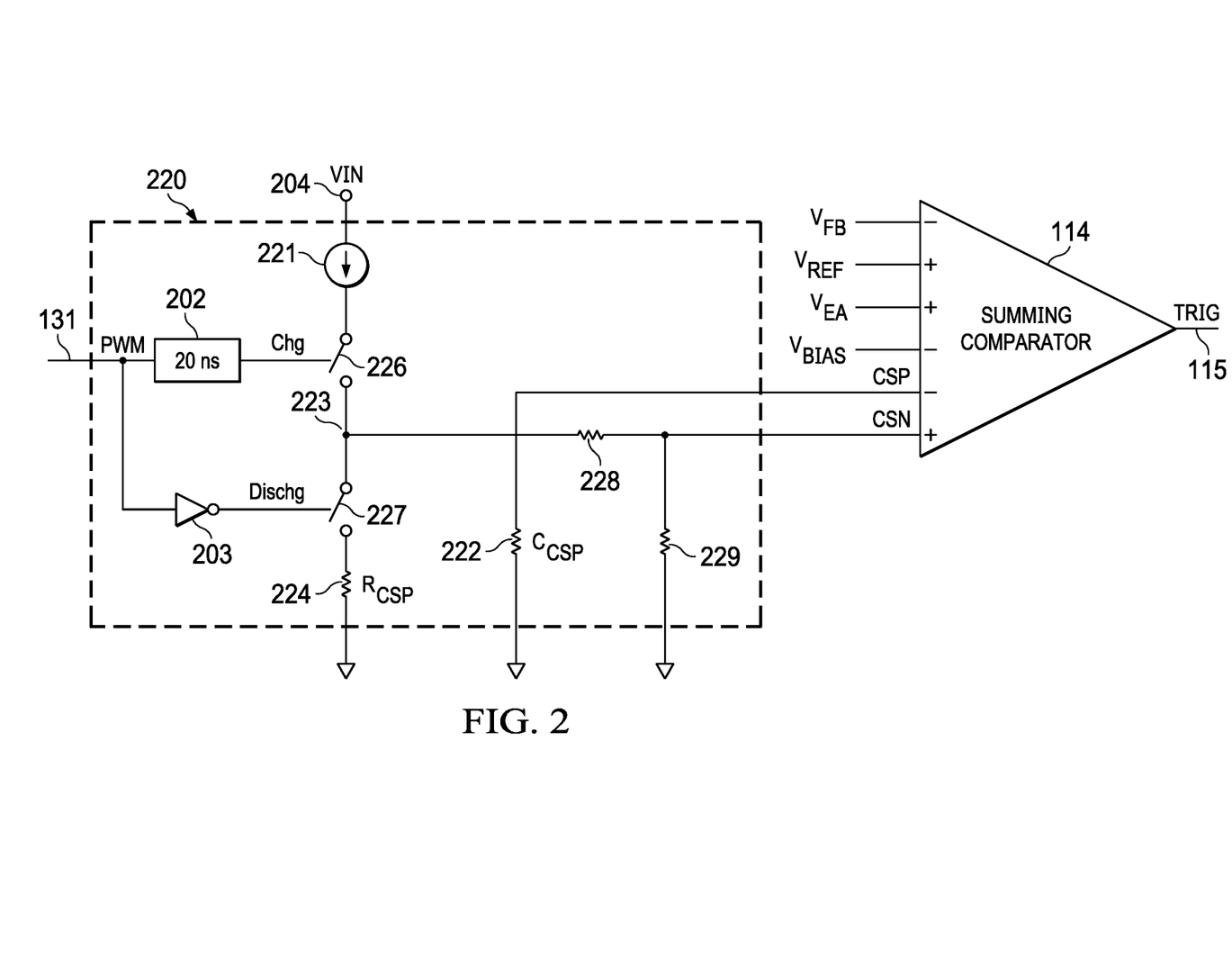
FIG. 2 is a schematic of an example constant amplitude ramp generator.
Figure 3:
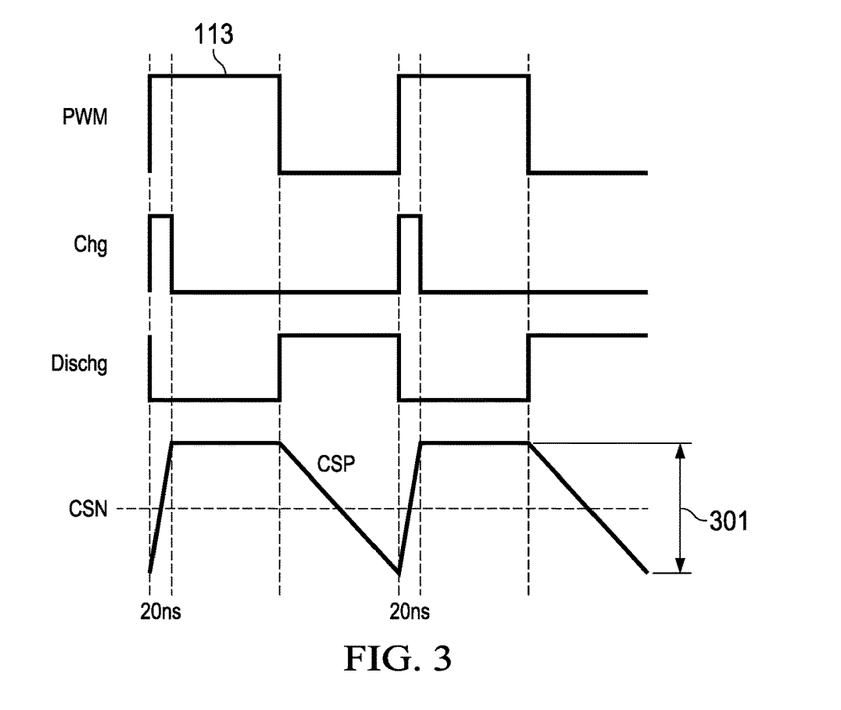
FIG. 3 is a set of plots illustrating operation of the example constant amplitude ramp generator of FIG. 2.

FIG. 2 is a schematic of an example constant amplitude ramp generator 220 that may be used as ramp generator 120 (FIG. 1). FIG. 3 is a set of plots illustrating operation of the example constant amplitude ramp generator 220 of FIG. 2. In this example, a current source 221 is a charge source that has an input coupled to input terminal 204 and an output coupled to a terminal on switch 226. Current source 221 charges a capacitor (Ccsp) 222 for a fixed period of time from input voltage terminal (Vin) 204. In this example, the current sense positive (CSP) signal is generated on ramp terminal 223, which is then filtered by resistor 228 and capacitor 229 to form the current sense negative (CSN) signal. In this example, Vin terminal 204 is coupled to supply 102 (FIG. 1). In another example, Vin 204 may be coupled to a sub-regulator supply or other voltage source.

Precision timer 202 generates a charge control pulse (Chg) each time PWM signal 131 is asserted. In this example, timer 202 generates a 20ns pulse that turns on switch 226 for 20ns. Capacitor 222 is then discharged by a resistor (Rcsp) 224 while the low side FET 154 (FIG. 1) in the power converter is on by turning on switch 227 using an inverted PWM discharge control (Disch) signal provided by inverter 203. The charging time and the charging current set the height 301 of the ramp which is constant with duty cycle. In this example, the charging time is set by timer 202 to be 20ns. In another example a different charging time may be used.

In this example, charging switch 226 and discharge switch 227 are FETs. In other examples, various types of known or later developed semiconductor switching devices may be used for switches 226, 227.

In this example, current source 221 is a simple polysilicon resistor. In another example, known or later developed current source techniques may be used, a biased FET, a JFET, etc. In some examples, a precision trimmed current source may be used.

Constant amplitude ramp generator 220 is area efficient when fabricated on an integrated circuit. However, it does require a precise timer 202 that may be difficult to provide over a range of integrated circuit (IC) process steps and operating temperature range. A precision trimmed current source may require significant IC area and have a significant current consumption.

Figure 4:
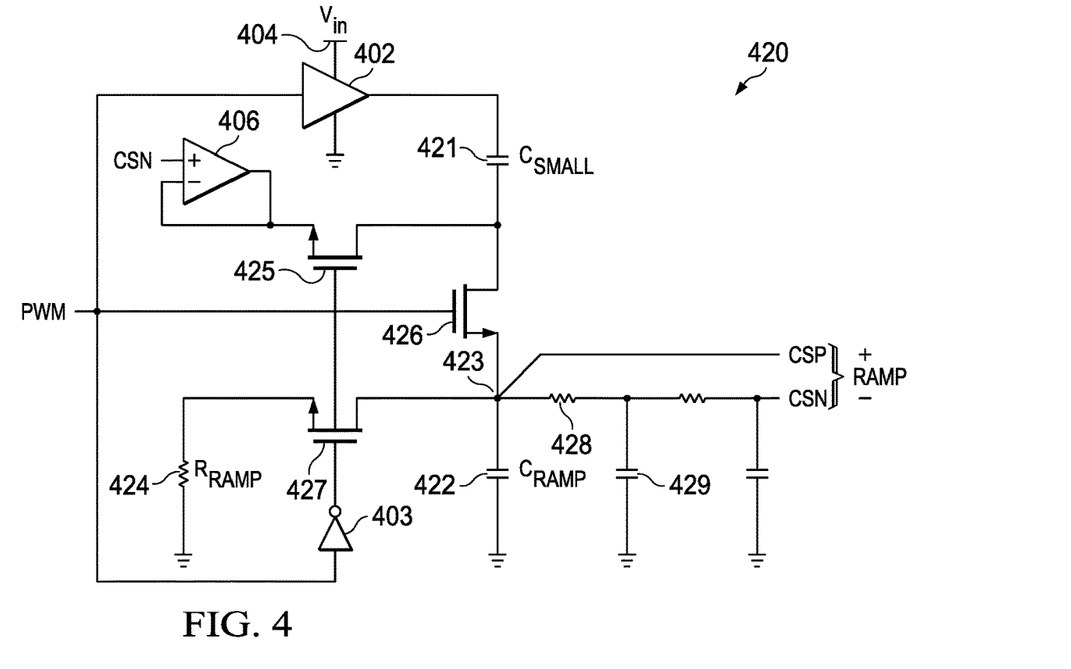
FIG. 4 is a schematic of another example constant amplitude ramp generator.
Figure 5:
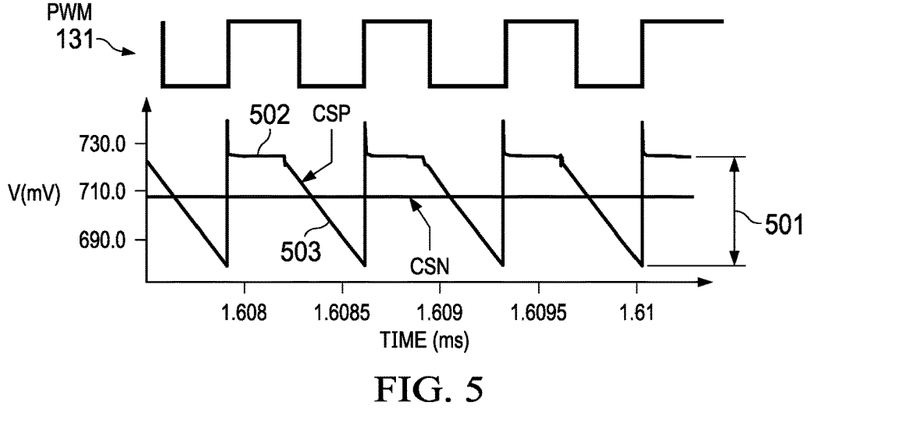
FIG. 5 is a plot illustrating operation of the example constant amplitude ramp generator of FIG. 4.

FIG. 4 is a schematic of another example constant amplitude ramp generator 420 that may be used as ramp generator 120 (FIG. 1). FIG. 5 is a plot illustrating operation of the example constant amplitude ramp generator 420. In this example, input voltage terminal (Vin) 404, is coupled to supply 102 (FIG. 1). In another example, Vin 404 may be coupled to a sub-regulator supply or other voltage source. In another example, a sub-regulator supply voltage may be varied to fine tune the transient response. In this example, a switched capacitor circuit that includes a small capacitor (Csmall) 421 and ramp capacitor (Cramp) 422 is used to set the height 501 of the ramp. The ramp height will be governed by the supply voltage 404 and by a ratio of capacitors 421, 422 making it more immune to IC fabrication process and operating temperature variations.

Figure 6A:
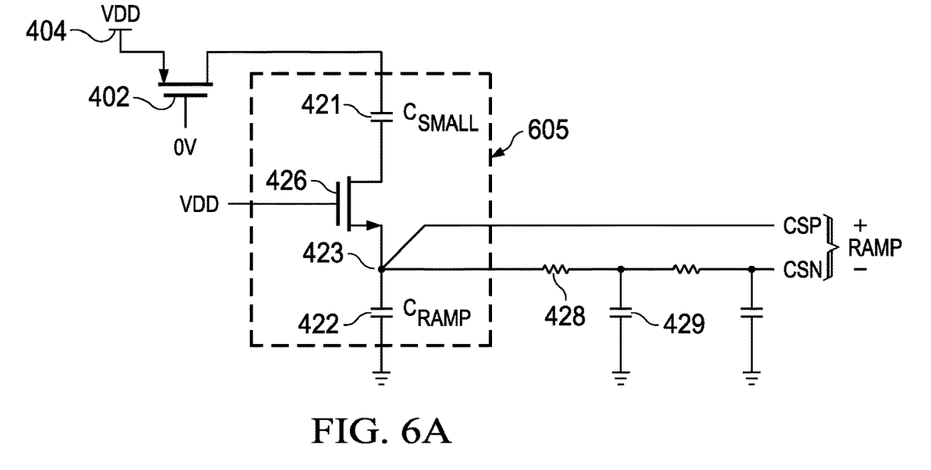
FIGS. 6A and 6B are schematics illustrating operation of the example constant amplitude ramp generator of FIG. 4.

FIGS. 6A and 6B illustrate operation of the example constant amplitude ramp generator 420 of FIG. 4. Current sense signal CSP is formed on ramp terminal 423. Referring to FIG. 6A, in a first state while PWM signal 131 (FIG. 4) is "high," switch 426 is closed and buffer 402 is outputting a high signal, that is essentially equal to the input voltage level on supply terminal 404, referred to as VDD, that is coupled to a supply input terminal of buffer 402. In this example, switch 426 is an FET that is conductive when VDD is applied to its gate element in response to PWM signal 131 being high. In this mode, buffer 402 is a charge source and a voltage equal to approximately VDD provided on the output terminal of buffer 402 is applied across capacitor divider 605 that includes small capacitor (Csmall) 421 and ramp capacitor (Cramp) 422. When switch 426 is closed, a voltage step is produced on ramp terminal 423 that is approximately equal the ratio of Csmall 421 and Cramp 422, as indicated at 502 (FIG. 5).

Figure 6B:
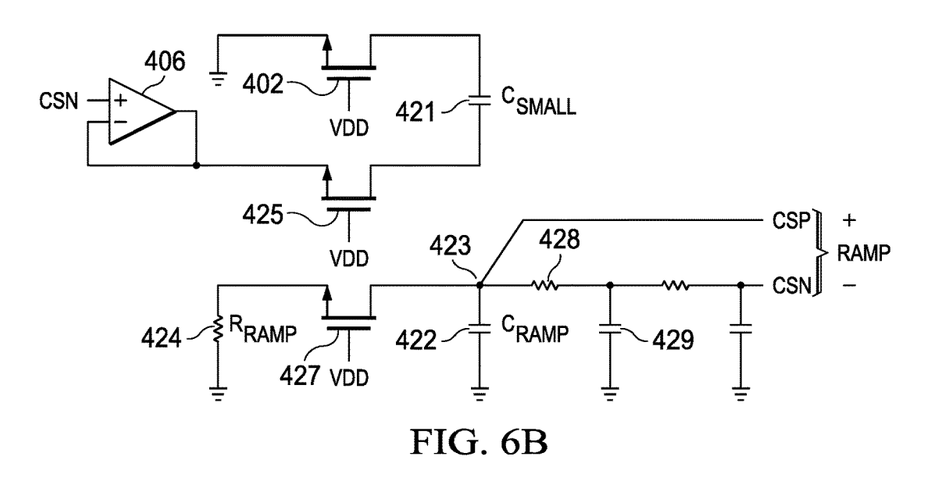

Referring to FIG. 6B, in a second state while PWM signal 131 is "lo," switch 426 is open and switches 425 and 427 are closed in response to PWM signal 131 being lo. In this example, PWM signal 131 is inverted by inverter 403 (FIG. 4) so that a high logic level is applied to the gates of FET switch transistors 425, 427. Buffer 402 likewise connects its output to ground in response to PWM signal 131 being lo. In this mode, small capacitor 421 is pre-charged by switch 425 to a voltage provided by pre-charge source 406 which is approximately equal to—CSN. This makes the ramp amplitude equal to VDD*Csmall/Cramp. In this example, pre-charge source 406 is an opamp with a feedback loop configured to operate the opamp with a gain equal to one. Current sense negative signal CSN is connected to a non-inverting input of opamp 406. Ramp capacitor 422 is discharged through ramp capacitor 424 to form voltage ramp 503 (FIG. 5) on current sense signal CSP. Signal CSP is filtered by one or more filter stages, such as resistor 428 and capacitor 429 to form the current sense negative (CSN) signal.

The ratio of Csmall 421 and Cramp 422 set the height 501 of the ramp which is constant with duty cycle. In this example, the peak-to-peak amplitude 501 (FIG. 5) of CSP is approximately 40mV. In this example, the frequency of PWM signal 131 is approximately 500KHz to 2MHz. In other examples, the operating frequency may be higher or lower. The DCAP architecture is a Constant On-Time topology that does not have a clock. The summing comparator 114 (FIG. 1) produces a "trigger" signal 115 (FIG. 1) that initiates the PWM rising edge. The PWM on-time is set by the on-timer 132 (FIG. 1) which is configured to the target operating frequency range. After the on-timer expires, the PWM goes low. The next trigger from the Summing Comparator is expected when the VFB+VCSP falls below VREF+VCSN. Frequency ideally stays constant with Vout because the on-timer has Vin information which scales the on-time appropriately.

Figure 7A:
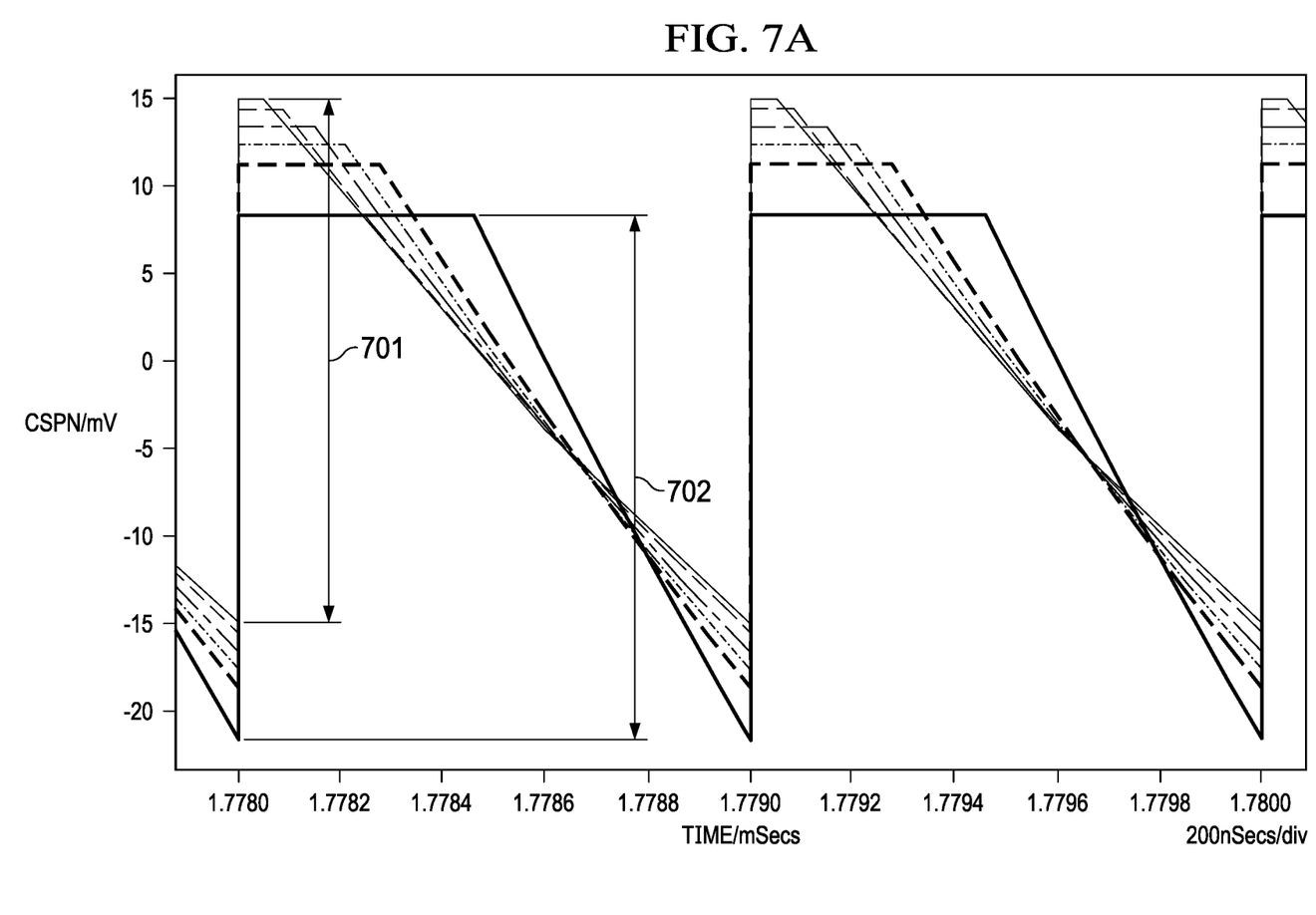
FIGS. 7A, 7B are plots illustrating operation of described example constant amplitude ramp generators.
Figure 7B:
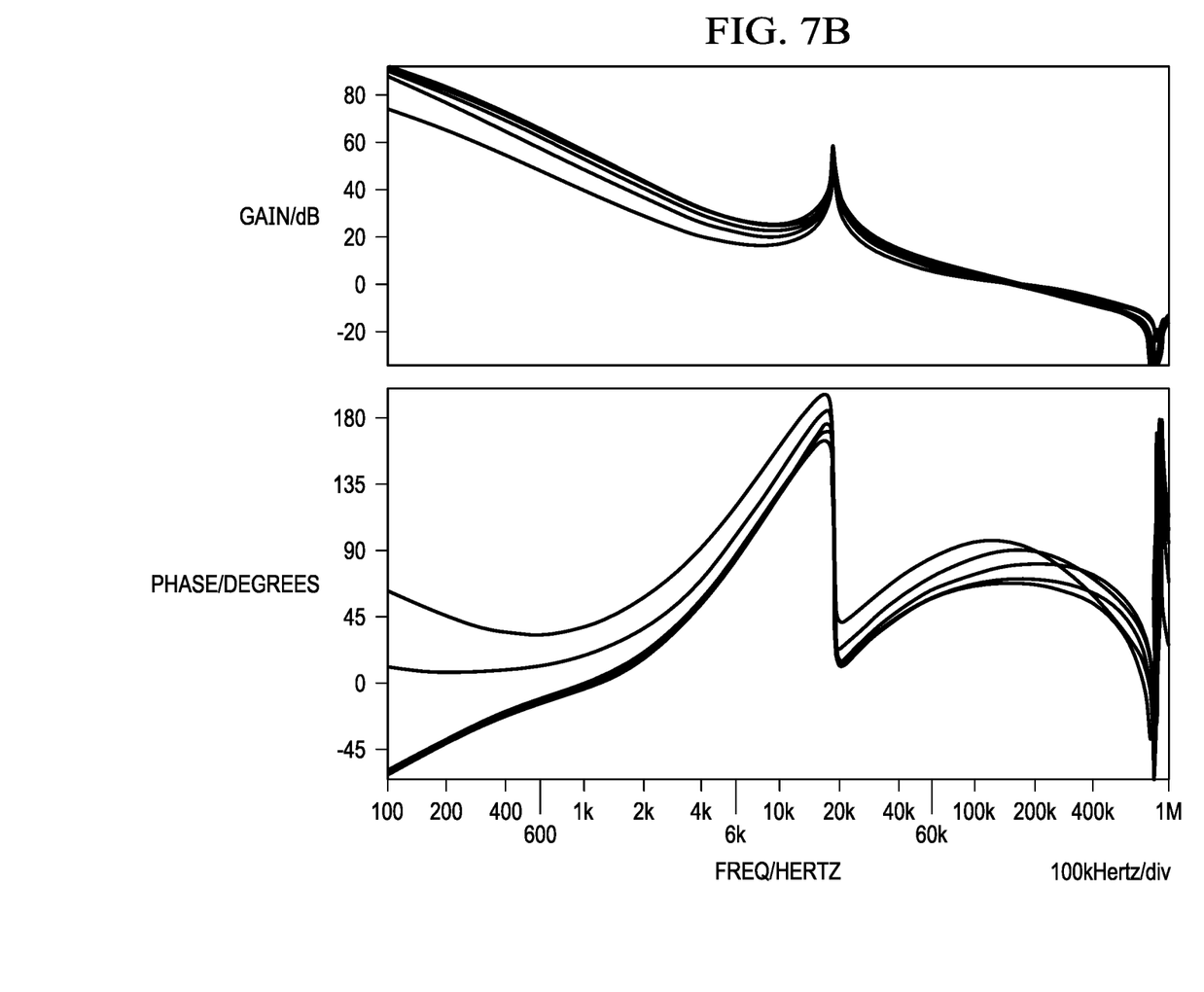

FIGS. 7A, 7B are plots illustrating operation of example constant amplitude ramp generators. FIG. 7A is a plot of current sense signal CSP-CSN in mV vs time in mSec for a range of output voltages 151 (FIG. 1) from 0.6 — 5.5 V. For example, at Vout =0.6 V, the peak-to-peak amplitude is approximately 30mV, as indicated at 701. At Vout=5.5 V, the peak-to-peak amplitude is also approximately 30mV, as indicated at 702.

In FIG. 7A, the CSP-CSN plots illustrate where the dc part of the ramp (CSN which is filtered CSP) is subtracted from the CSP so the ramp has an average of 0V but due to the flat top nature of the ramp, it seems the ramp is shifted down but actually it is not. All the cases from 0.6V plot 701 to 5.5V plot 702 have 0V average; accordingly, the volt-second range above 0V is the same as the volt-second range below 0V. However, the CSP by itself moves up based on the duty cycle but that is not observed in final ramp (CSP-CSN) as the CSN is subtracted.

The down slope in CSP changes based on duty cycle. In periodic steady state, the amount by which the CSP moves up is the same as the amount by which it moves down. The time for which the down slope exists is (1-D)*T time. The amount by which the CSP goes up is constant (constant amplitude ramp). To make the downward movement the same as the upward movement within (1-D)*T, the common mode voltage of the CSP signal of the ramp goes up for high duty (downslope is proportional to common mode voltage divided by R_RAMP*C_RAMP) but the amplitude stays the same; accordingly, the "ac" part of the ramp is the same.

FIG. 7B is a Bode magnitude plot (gain in dB) and Bode phase plot (phase in degrees) vs frequency in Hertz of the frequency response of example control circuit 110 using constant amplitude ramp circuit 120 across an output voltage range of 0.6-5.5V. These Bode plots illustrate a very similar loop crossover irrespective of Vout. The loop bandwidth is approximately constant as Vout changes from 0.6 to 5.5 volts. Typical loop controllers in which a ramp generator is coupled to a switching terminal typically have loop bandwidth changes of 4x as output voltage ranges from 0.6 to 5.5 volts.

Figure 8:
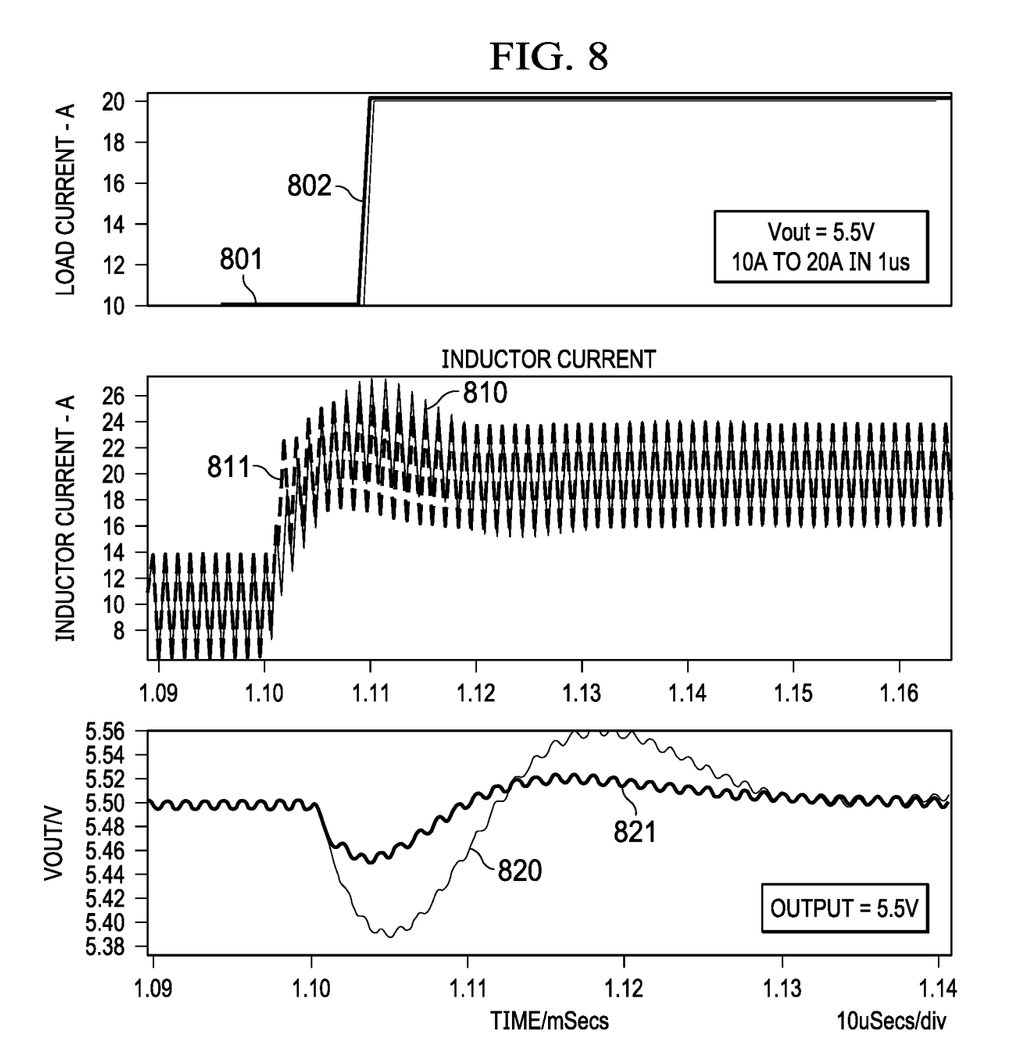
FIG. 8 are plots illustrating operation of a described example converter during a load transient.

FIG. 8 are plots illustrating simulated operation of a described example converter 100 (FIG. 1) during a load transient. In this example, Vout is 5.5V. Output inductor 155 (FIG. 1) is sized to be 457 nH, output capacitor 156 is sized to be 159µF, which is small in order to exaggerate load transients for this illustration.

In this example, a load current 801 of 10A is being drawn by variable load 106 (FIG. 1). At 802, the load is transitioned to 20A in 1µs. Plot 810 represents load current through an inductor and plot 820 represents output voltage for a prior converter that uses a ramp generator connected to switching terminal 152. Plot 811 represents load current through inductor 155 and plot 821 represents output voltage of example converter 100 that uses a constant amplitude ramp circuit.

Output voltage plot 820 illustrates an undershoot of approximately 100mV in response to load transient 802, while plot 821 illustrates an undershoot of only 40mV for described example converter 100 that uses a constant amplitude ramp generator. Thus, a significant improvement in converter operation is provided by a constant amplitude ramp generator.

Figure 9:
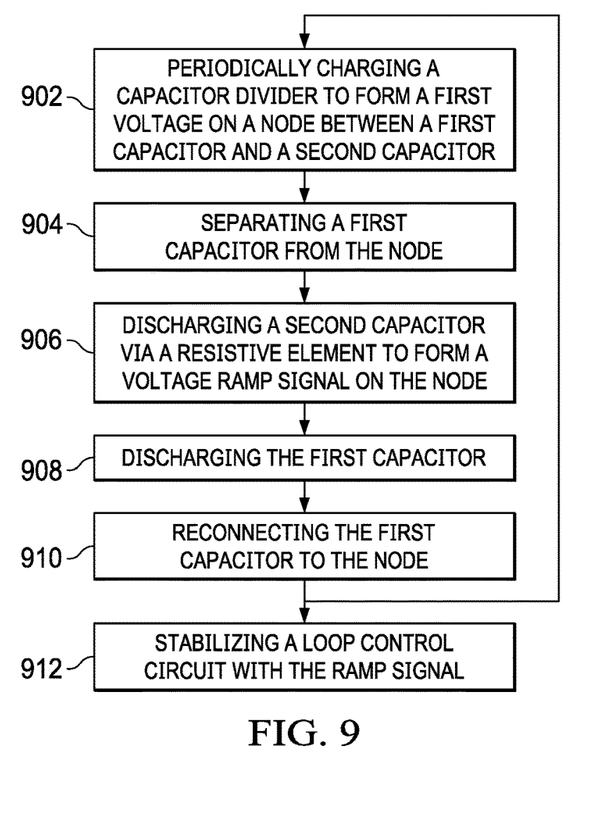
FIGS. 9-10 are flow diagrams illustrating operation of example constant amplitude ramp circuits.

FIG. 9 is a flow diagram illustrating operation of an example constant amplitude ramp circuit, such as constant amplitude ramp circuit 420 in FIG. 4. In this example, a switched capacitor circuit that includes a small capacitor (Csmall) 421 and ramp capacitor (Cramp) 422 is used to set the height 501 (FIG. 5) of the ramp. The ramp height will be governed by the supply voltage 404 and by a ratio of capacitors 421, 422 making it more immune to IC fabrication process and operating temperature variations.

At 902, a capacitor divider is charged periodically by a voltage source to produce a first voltage value on a ramp terminal, such as ramp terminal 423 (FIG. 4), coupled between a terminal of a first capacitor, such as Csmall 421, and a terminal of a second capacitor, such as Cramp 422, of the capacitor divider.

At 904, the terminal of the first capacitor is periodically separated from the ramp terminal. In the example ramp circuit 420, switch 426 is opened periodically in response to pulse signal PWM 131.

At 906, the second capacitor is discharged via a resistive element, such as resistor Rramp 424 (FIG. 4), while the first capacitor is separated from the ramp terminal to generate a voltage ramp across the second capacitor to a second voltage value. In the example ramp circuit 420, switch 427 is closed in response to pulse signal PWM 131 being in a low, or de-asserted, logic state.

At 908, the first capacitor is discharged while it is separated from the ramp terminal. In the example ramp circuit 420, capacitor Csmall 421 is discharged by closing switch 425 to couple one terminal of Csmall to ground while driving the output of buffer 402 to ground in response to pulse signal PWM 131.

At 910, the first capacitor is reconnected to the ramp terminal.

This sequence is continuously repeated during operation of the constant amplitude ramp circuit.

At 912, a loop control circuit, such a loop control circuit 112 (FIG. 1), is stabilized with the ramp voltage formed on the ramp terminal.

Figure 10:
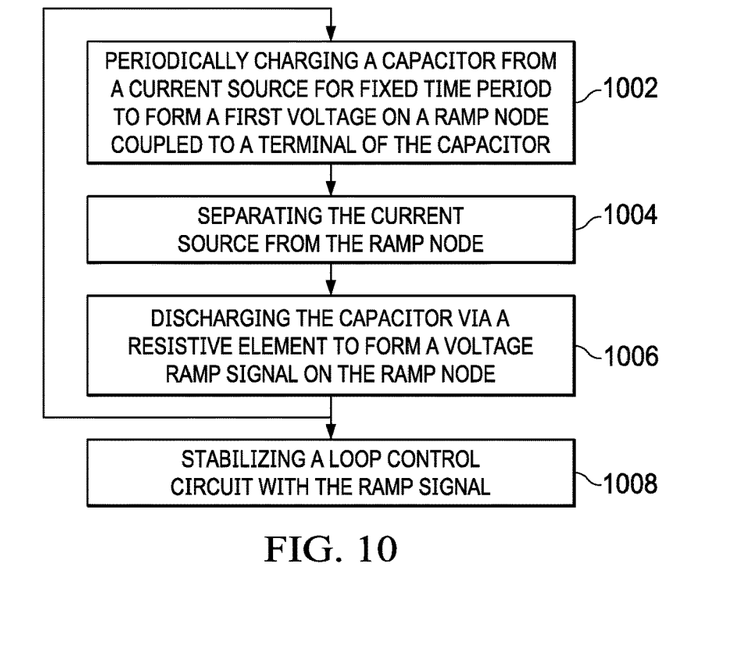

FIG. 10 is a flow diagram illustrating operation of an example constant amplitude ramp circuit, such as constant amplitude ramp circuit 220 in FIG. 2. In this example, a switched capacitor circuit that includes a ramp capacitor (Ccsp) 222 is used to set the height 301 (FIG. 3) of the ramp. The ramp height will be governed by the supply voltage 204 and by a length of time the capacitor is charged, making it more immune to IC fabrication process and operating temperature variations.

At 1002, a capacitor, such as Ccsp 222, is charged periodically by a current source, such as current source 221 (FIG. 2), by coupling an output of the current source to the capacitor for a fixed period of time to produce a first voltage value on a ramp terminal, such as ramp terminal 223 (FIG. 2), coupled between a terminal of the capacitor and the output of the current source. In the example ramp circuit 220, a fixed timer 202 causes switch 226 to close for a fixed amount of time in response to pulse signal PWM 131 to cause current source 221 to charge capacitor 222 for a fixed amount of time. In this example, the fixed time is 20ns.

At 1004, the output of the current source is periodically separated from the ramp terminal. In the example ramp circuit 220, switch 226 is opened at the end of the fixed time period in response to pulse signal PWM 131.

At 1006, the capacitor is discharged via a resistive element, such as resistor Rcsp 224 (FIG. 2), while the current source is separated from the ramp terminal to generate a voltage ramp across the capacitor to a second voltage value. In the example ramp circuit 220, switch 227 is closed in response to pulse signal PWM 131 being in a low, or de-asserted, logic state.

This sequence is continuously repeated during operation of the constant amplitude ramp circuit.

At 1008, a loop control circuit, such a loop control circuit 112 (FIG. 1), is stabilized with the ramp voltage formed on the ramp terminal.

In described examples, simple circuits for a constant amplitude ramp generator are provided. The circuits can be configured to emulate only a relevant slope depending on the controller configuration. A down slope is provided for DCAP2/3 type controllers that use valley current and an up slope is provided for advanced current mode (ACM) type controllers that use emulated peak current mode control. As described hereinbelow, a constant amplitude ramp generator is provided in which the ramp amplitude depends on the PWM timing rather than on the input voltage value.

OTHER EMBODIMENTS

In described examples, a loop control circuit is used to control a buck converter to can be configured to operate across a range of output voltage from 0.6 to 5.5 volts. In described examples, an output current of at least 20 amps is provided. In another example, other types of switching converters may use a constant amplitude ramp circuit as described herein, such as a boost converter for generating an output voltage that is higher than its input voltage.

In other examples, multiphase converters may be implemented to allow higher output currents.

In described examples of a capacitor divider implementation, one capacitor is pre-charged to a -CSN during a second state of operation. In another example, the capacitor may be pre-charged to 0 volts by connecting it to ground during the second state of operation. This is feasible for low duty cycle cases, such as Vin=12V and Vout is approximately 1V.

In other examples, various types of systems that utilize an I, PI or a PID controller to control an output value can reduce undershoot of the output value by using a constant amplitude ramp generator as described herein.

In described examples, system circuitry that includes a switching regulator is controlled by a loop controller that uses a constant amplitude ramp generator. In another example, another type of system circuitry may be controlled by a loop controller that uses a constant amplitude ramp generator. For example, the system circuitry may be process control logic for various types of processes, such as: controlling manufacturing machinery, electric motor speed control, flow control, temperature control, pressure control, level control, etc.

In this description, the term "couple" and derivatives thereof mean an indirect, direct, optical, and/or wireless electrical connection. Thus, if a first device couples to a second device, that connection may be through a direct electrical connection, through an indirect electrical connection via other devices and connections, through an optical electrical connection, and/or through a wireless electrical connection.

Modifications are possible in the described embodiments, and other embodiments are possible, within the scope of the claims.

What is claimed is:

1. A system comprising:
    a capacitor coupled between a ramp terminal and a ground terminal;
    a resistor having first and second resistor terminals, the first resistor terminal coupled to the ground terminal;
    a first switch having first and second switch terminals and a first control terminal, the first switch terminal coupled to the ramp terminal, and the second switch terminal coupled to the second resistor terminal;
    a current source having a supply input terminal and a current output terminal, the supply input terminal coupled to a voltage supply terminal;
    a second switch having third and fourth switch terminals and a second control terminal, the third switch terminal coupled to the charge output terminal, and the fourth switch terminal coupled to the ramp terminal;
    a timer having a timer input and a timer output, the timer output selectively coupled to the second control terminal; and
    a pulse input coupled to the timer input and selectively coupled to the first control terminal.

2. The system of claim 1, wherein the current source is a resistor.

3. The system of claim 1, wherein the timer is configured to generate a 20us pulse in response to each pulse received the pulse input.

4. The system of claim 1, wherein the capacitor is a first capacitor, the current source is a buffer further having a buffer input, and wherein the system further comprises:
    a second capacitor coupled between the charge output terminal and the third switch terminal; and
    a third switch having fifth and sixth switch terminals, the fifth switch terminal coupled to the third switch terminal.

5. The system of claim 4, further comprising a pre-charge source having a pre-charge input and a pre-charge output, the pre-charge output coupled to the sixth switch terminal.

6. The system of claim 5, further comprising a filter having a filter input and a filter output, the filter input coupled to the ramp terminal, the filter output coupled to the pre-charge input.

7. The system of claim 4, wherein the pulse input is controllably coupled to the first, second, and third switches and coupled to the buffer input, and the second switch is configured to be closed while the charge output terminal is active and the first and third switches are open.

8. The system of claim 1, further comprising:
    a filter having a filter input and a filter output, the filter input coupled to the ramp terminal;
    a loop control circuit having a feedback input, first sense input, a second sense input, and a loop control output, the first sense input coupled to the ramp terminal, the second sense input coupled to the filter output; and
    converter circuitry having a converter input and a converter output, the converter output coupled to the feedback input, the converter input coupled to the loop control output.

9. The system of claim 8, further comprising pulse width modulation (PWM) logic coupled between the loop control circuit and the converter circuitry, the PWM logic having a pulse output and a pulse logic input, the pulse logic input coupled to the loop control output, the pulse output controllably coupled to the first and second switches.

10. A method of operating a ramp generator circuit, the method comprising:
    charging a capacitor divider periodically by a voltage source to produce a voltage on a ramp terminal coupled between a terminal of a first capacitor and a terminal of a second capacitor of the capacitor divider;
    separating the terminal of the first capacitor from the ramp terminal periodically;
    discharging the second capacitor to generate a voltage ramp signal on the ramp terminal while the first capacitor is separated from the ramp terminal; and
    pre-charging the first capacitor while it is separated from the ramp terminal.

11. The method of claim 10, further comprising:
    filtering the voltage ramp signal; and
    pre-charging the first capacitor with a voltage representative of the filtered voltage ramp signal.

12. The method of claim 10, further comprising stabilizing a loop control circuit with the voltage ramp signal formed on the ramp terminal.

13. The method of claim 10, wherein discharging the second capacitor is performed by coupling a resistive element to the second capacitor while the first capacitor is separated from the ramp terminal.

14. The method of claim 10, wherein charging the capacitor divider periodically is performed by an output of a buffer in which a pulsed signal is provided to an input of the buffer.

15. A method of operating a ramp generator circuit, the method comprising:

charging a first capacitor periodically for a fixed amount of time by a current source to produce a first voltage value on a ramp terminal coupled to a terminal of the first capacitor, the magnitude of the first voltage determined by the capacitance of a second capacitor coupled between the current source and the ramp terminal;

separating the current source from the ramp terminal; and discharging the first capacitor to generate a voltage ramp across the first capacitor while the current source is separated from the ramp terminal.

16. The method of claim 15, wherein discharging the first capacitor is performed by coupling a resistive element to the first capacitor while the first capacitor is separated from the current source.

17. The method of claim 15, further comprising stabilizing a loop control circuit with the ramp voltage formed on the ramp terminal.

* * * * *